United States Patent [19]

Nakamura

[11] Patent Number: 5,721,709
[45] Date of Patent: Feb. 24, 1998

[54] ADDRESS DECODER CIRCUITS ADJUSTED FOR A HIGH SPEED OPERATION AT A LOW POWER CONSUMPTION

[75] Inventor: Kazuyuki Nakamura, Tokyo, Japan

[73] Assignee: NEC Corporation, Tokyo, Japan

[21] Appl. No.: 630,688

[22] Filed: Apr. 12, 1996

[30] Foreign Application Priority Data

Apr. 13, 1995 [JP] Japan ................................. 7-111049

[51] Int. Cl.$^6$ ................................................. G11G 8/00
[52] U.S. Cl. ........................... 365/230.06; 365/230.88
[58] Field of Search ...................... 365/230.06, 230.08

[56] References Cited

U.S. PATENT DOCUMENTS 5,402,377  3/1995  Ohhata et al. .................. 365/230.06

*Primary Examiner*—David C. Nelms
*Assistant Examiner*—F. Niranjan
*Attorney, Agent, or Firm*—Young & Thompson

[57] ABSTRACT

A decoder circuitry is provided between input signal lines and word lines. The number of the word lines is larger than the input signal lines. The decoder circuitry comprises a plurality of stages including at least an input side stage adjacent to the input signal lines and an output side stage adjacent to the word lines. Each of the plurality of stages includes plural logic circuits. The plural stages so vary as not to decrease in the number of the logic circuits when the stage approaches to the word lines so that the number of the logic circuits in the input side stage adjacent to the input signal lines is smaller than the number of the logic circuits in the output side stage adjacent to the word lines. Each of the logic circuits has a plurality of field effect transistors. The field effect transistors so vary as not to decrease in absolute value of threshold voltage when the stage approaches to the word lines so that an absolute value of threshold voltage of the transistors provided in the input side stage adjacent to the input signal lines is smaller than an absolute value of threshold voltage of the transistors provided in the output side stage adjacent to the word lines.

56 Claims, 2 Drawing Sheets

ADDRESS DECODER CIRCUITS ADJUSTED FOR A HIGH SPEED OPERATION AT A LOW POWER CONSUMPTION

BACKGROUND OF THE INVENTION

The present invention relates to a decoder circuit, and more particularly to an address decoder circuit adjusted for a high speed performance at a low power consumption.

Decoder circuits such as an address decoder circuit used for semiconductor memories, for example, static random access memories (SRAMs) comprise input buffer circuits, predecoder circuits, intermediate address selection circuits and word line selection circuits. The same number of the input buffer circuits are provided as the number of address input signals so that each of the input buffer circuits is connected to the corresponding one of address input signal lines on which the address input signals are transmitted. At least the same number of the predecoder circuits are electrically connected to the input buffer circuits. Namely, at least one of the predecoder circuits is connected to each of the input buffer circuits. At least the same number of but normally a larger number of the intermediate address selection circuits are provided to be connected to the predecoder circuits. Namely, at least one of but normally a plurality of the intermediate address selection circuits is provided to be connected to each of the predecoder circuits. At least the same number of but normally a larger number of the word line selection circuits are provided to be connected to the intermediate address selection circuits. Namely, at least one of but normally a plurality of the word line selection circuits is provided to be connected to each of the intermediate address selection circuits. Each of the word line selection circuits is connected to the corresponding one of word lines. In any event, the rate of increase in the numbers of the above individual circuits are so determined that the number of the word lines or the word line selection circuits be the "Nth" power of 2, where the number of the address input signals is "N". If the decoder circuit is applied to for example 16 bit-SRAM, the number of address input signals is 16. Thus, the necessary number of the word lines or the word line selection circuits is over sixty thousands. If the decoder circuit is applied to for example 32 bit-SRAM, then the necessary number of the word lines or the word line selection circuits is actually over six billions.

On the other hand, the above individual circuits comprise logic circuits which normally include complementary metal insulator semiconductor transistors circuits (CMIS circuits). Each of the CMIS circuits comprises a pair of n-channel and p-channel MISFETs. Normally, all of the n-channel and p-channel MISFETs integrated in the semiconductor integrated circuit are so set as to have a uniform threshold voltage in absolute value.

Recently, requirements for an improvement in high speed performance of the LSI circuits have been on the increase. For this purpose, it is essential to improve the high speed performance of the decoder circuits. As described above, the decoder circuits include logic circuits including CMIS circuits which comprises metal insulator semiconductor field effect transistors (MISFETs). In order to improve the high speed performance of the decoder circuits, it is required to increase ON-current of the above transistors. In view of the increase in the ON-current of the above transistors, it is effective to reduce the absolute value of the threshold voltages of the p-channel and n-channel MISFETS. However, the reduction in the absolute value of the threshold voltages of the p-channel and n-channel MISFETs can result in increase in current leakage of the p-channel and n-channel MISFETs placed in a stand-by state. The increase in current leakage of the p-channel and n-channel MISFETs placed in a stand-by state causes an increase in power consumption of the decoder circuits.

Accordingly, in prior art, if the threshold voltage of the decoder circuits are so set as to improve the high speed performance, it is likely difficult to suppress the current leakage of the decoder circuits placed in the stand-by state. If, however, the threshold voltage of the decoder circuits are so set as to suppress the current leakage thereof, it is likely difficult to improve the high speed performance. In conclusion, in the prior art, it was difficult to achieve both the improvement in the high speed performance of the decoder circuits and the suppression in the current leakage thereof even they are required.

SUMMARY OF THE INVENTION

Accordingly, it is an object of the present invention to provide a novel decoder circuitry free from any problems and disadvantages as described above.

It is a further object of the present invention to provide a novel decoder circuitry showing an improved high speed performance.

It is a furthermore object of the present invention to provide a novel decoder circuitry having a reduced power consumption.

The above and other objects, features and advantages of the present invention will be apparent from the following descriptions.

The present invention provides a decoder circuitry comprising first, second and third stages. The first stage includes input buffer circuits which are electrically connected to input signal lines. The number of the input buffer circuits is equal to the number of the input signal lines. The input buffer circuits include first p-channel field effect transistors and first n-channel field effect transistors. The first p-channel and n-channel field effect transistors have a first threshold voltage in absolute value. The second stage includes predecoder circuits which are electrically connected to the input buffer circuits. The number of the predecoder circuits is not less than the number of the input buffer circuits. The predecoder circuits include second p-channel field effect transistors and second n-channel field effect transistors. The second p-channel and n-channel field effect transistors have a second threshold voltage in absolute value which is not less than the first threshold voltage in absolute value. The third stage includes intermediate address selection circuits which are electrically connected to the predecoder circuits. The number of the intermediate address selection circuits is not less than the number of the predecoder circuits. The intermediate address selection circuits include third p-channel field effect transistors and third n-channel field effect transistors. The third p-channel and n-channel field effect transistors have a third threshold voltage in absolute value which is not less than the second threshold voltage in absolute value. The fourth stage includes word line selection circuits which are electrically connected to the intermediate address selection circuits. Each of the word line selection circuits is electrically connected to a word line. The number of the word line selection circuits is not less than the number of the intermediate address selection circuits and being larger than the number of the input buffer circuits. The word line selection circuits include fourth p-channel field effect transistors and fourth n-channel field effect transistors. The fourth p-channel and n-channel field effect transistors have a fourth threshold voltage in absolute value which is not less than the third threshold voltage in absolute value. The fourth threshold voltage in absolute value is larger than the first threshold voltage in absolute value.

The probability of operations of the transistors on the fourth stage is lower than the probability of operations of the transistors on the first stage since the number of the transistors on the fourth stage is smaller than the number of the transistors in the fourth stage. This means that the probability that the transistors on the fourth stage is in the stand-by state is larger than the probability that the transistors on the fourth stage is in the stand-by state. Namely, the transistors on the fourth stage are almost always in the stand-by state, whilst the transistors on the first stage are often in the operating state. For the above reasons, the threshold voltage of the transistors on the fourth stage has to be set at a relatively high to reduce a current leakage in the stand-by state. The transistors on the fourth stage, where the threshold voltage is set high, show not so high speed performance. Since, however, the probability that the transistors of the fourth stage are in the operating state is low, the above not so high speed performance of those transistors are not so influential in the operation speed of the decoder circuits.

The transistors on the first stage, where the threshold voltage is set low, show high speed performances. Since the transistors on the first stage are often in the operating state, the improvement in the high speed performance is influential in the high speed performance of the decoder circuits. Since, however, the transistors on the first stage are often in the non-stand-by state or in the operating state, the current leakage caused by the above low threshold voltage of the transistors is not so influential for a current leakage of the decoder circuit.

Accordingly, the above novel circuit configurations both of the low threshed voltage of the transistors on the first stage and of the high threshold voltage of the transistor on the fourth stage would result in that both the improvement in the high speed performance of the decoder circuits and the reduction in the current leakage can be obtained.

The present invention provides another decoder circuitry being provided between input signal lines and word lines. The number of the word lines is larger than the input signal lines. The decoder circuitry comprises a plurality of stages including at least an input side stage adjacent to the input signal lines and an output side stage adjacent to the word lines. Each of the plurality of stages includes plural logic circuits. The plural stages so vary as not to decrease in the number of the logic circuits when the stage approaches to the word lines so that the number of the logic circuits in the input side stage adjacent to the input signal lines is smaller than the number of the logic circuits in the output side stage adjacent to the word lines. Each of the logic circuits has a plurality of field effect transistors. The field effect transistors so vary as not to decrease in absolute value of threshold voltage when the stage approaches to the word lines so that an absolute value of threshold voltage of the transistors provided in the input side stage adjacent to the input signal lines is smaller than an absolute value of threshold voltage of the transistors provided in the output side stage adjacent to the word lines.

The probability of operations of the transistors on the output side stage is lower than the probability of operations of the transistors on the input side stage since the number of the transistors on the fourth stage is smaller than the number of the transistors in the output side stage. This means that the probability that the transistors on the output side stage is in the stand-by state is larger than the probability that the transistors on the output side stage is in the stand-by state. Namely, the transistors on the output side stage are almost always in the stand-by state, whilst the transistors on the input side stage are often in the operating state. For the above reasons, the threshold voltage of the transistors on the output side stage has to be set at a relatively high to reduce a current leakage in the stand-by state. The transistors on the output side stage, where the threshold voltage is set high, show not so high speed performance. Since, however, the probability that the transistors of the output side stage are in the operating state is low, the above not so high speed performance of those transistors are not so influential in the operation speed of the decoder circuits.

The transistors on the input side stage, where the threshold voltage is set low, show high speed performances. Since the transistors on the input side stage are often in the operating state, the improvement in the high speed performance is influential in the high speed performance of the decoder circuits. Since, however, the transistors on the input side stage are often in the non-stand-by state or in the operating state, the current leakage caused by the above low threshold voltage of the transistors is not so influential for a current leakage of the decoder circuit.

Accordingly, the above novel circuit configurations both of the low threshed voltage of the transistors on the input side stage and of the high threshold voltage of the transistor on the output side stage would result in that both the improvement in the high speed performance of the decoder circuits and the reduction in the current leakage can be obtained.

BRIEF DESCRIPTIONS OF THE DRAWINGS

Preferred embodiments of the present invention will be described in detail with reference to the accompanying drawings.

DISCLOSURE OF THE INVENTION

Figure 1:
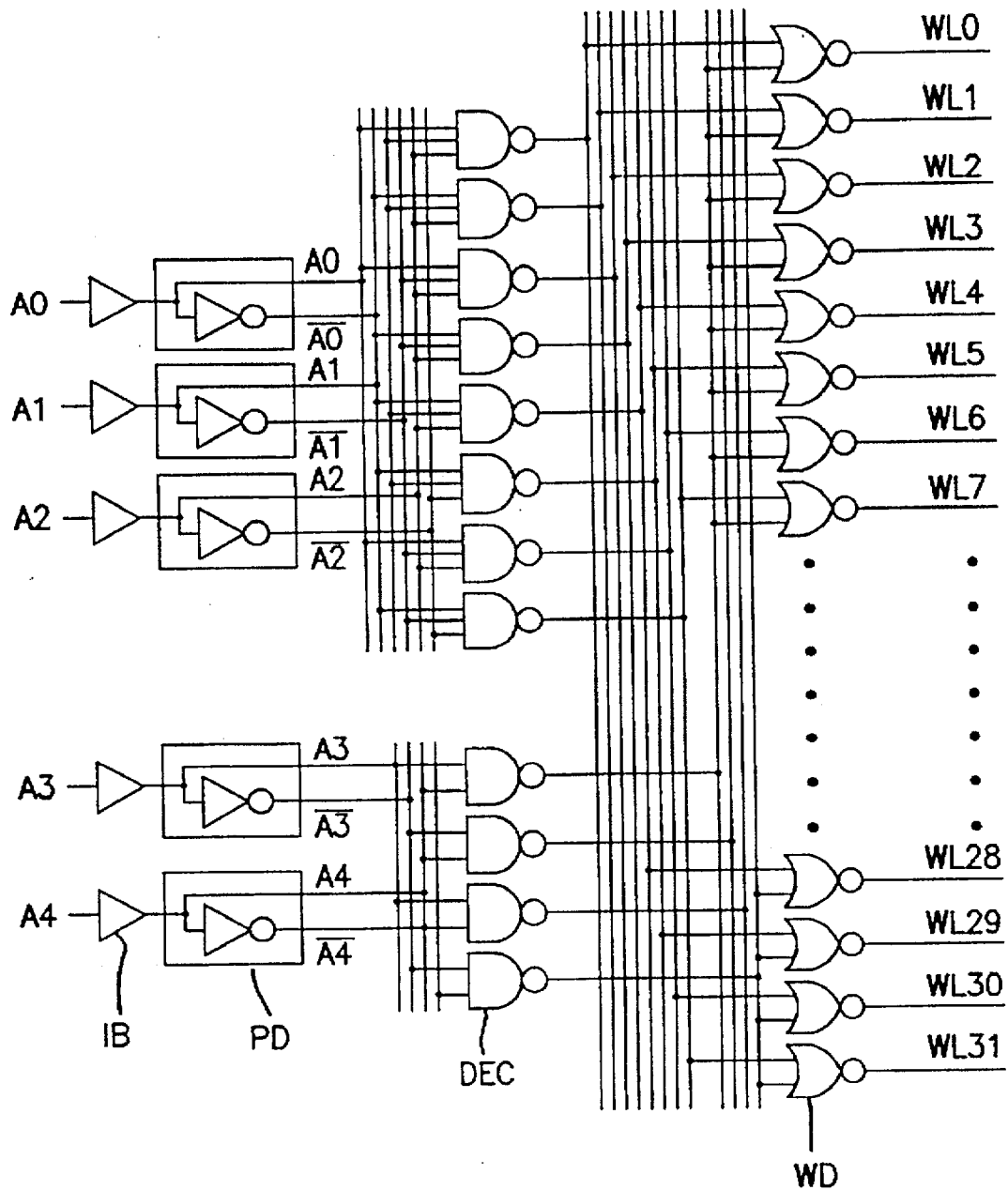
FIG. 1 is a circuit diagram illustrative of a novel decoder circuitry in a preferred embodiment according to the present invention.

The present invention provides a decoder circuitry comprising first, second and third stages. The first stage includes input buffer circuits which are electrically connected to input signal lines. The number of the input buffer circuits is equal to the number of the input signal lines. The input buffer circuits include first p-channel field effect transistors and first n-channel field effect transistors. The first p-channel and n-channel field effect transistors have a first threshold voltage in absolute value. The second stage includes predecoder circuits which are electrically connected to the input buffer circuits. The number of the predecoder circuits is not less than the number of the input buffer circuits. The predecoder circuits include second p-channel field effect transistors and second n-channel field effect transistors. The second p-channel and n-channel field effect transistors have a second threshold voltage in absolute value which is not less than the first threshold voltage in absolute value. The third stage includes intermediate address selection circuits which are electrically connected to the predecoder circuits. The number of the intermediate address selection circuits is not less than the number of the predecoder circuits. The intermediate address selection circuits include third p-channel field effect transistors and third n-channel field effect transistors. The third p-channel and n-channel field effect transistors have a third threshold voltage in absolute value which is not less than the second threshold voltage in absolute value. The fourth stage includes word line selection circuits which are electrically connected to the intermediate address selection circuits. Each of the word line selection circuits is electrically connected to a word line. The number of the word line selection circuits is not less than the number of the intermediate address selection circuits and being larger than the number of the input buffer circuits. The word line selection circuits include fourth p-channel field effect transistors and fourth n-channel field effect transistors. The fourth p-channel and n-channel field effect transistors have a fourth threshold voltage in absolute value which is not less than the third threshold voltage in absolute value. The fourth threshold voltage in absolute value is larger than the first threshold voltage in absolute value.

The probability of operations of the transistors on the fourth stage is lower than the probability of operations of the transistors on the first stage since the number of the transistors on the fourth stage is smaller than the number of the transistors in the fourth stage. This means that the probability that the transistors on the fourth stage is in the stand-by state is larger than the probability that the transistors on the fourth stage is in the stand-by state. Namely, the transistors on the fourth stage are almost always in the stand-by state, whilst the transistors on the first stage are often in the operating state. For the above reasons, the threshold voltage of the transistors on the fourth stage has to be set at a relatively high to reduce a current leakage in the stand-by state. The transistors on the fourth stage, where the threshold voltage is set high, show not so high speed performance. Since, however, the probability that the transistors of the fourth stage are in the operating state is low, the above not so high speed performance of those transistors are not so influential in the operation speed of the decoder circuits.

The transistors on the first stage, where the threshold voltage is set low, show high speed performances. Since the transistors on the first stage are often in the operating state, the improvement in the high speed performance is influential in the high speed performance of the decoder circuits. Since, however, the transistors on the first stage are often in the non-stand-by state or in the operating state, the current leakage caused by the above low threshold voltage of the transistors is not so influential for a current leakage of the decoder circuit.

Accordingly, the above novel circuit configurations both of the low threshold voltage of the transistors on the first stage and of the high threshold voltage of the transistor on the fourth stage would result in that both the improvement in the high speed performance of the decoder circuits and the reduction in the current leakage can be obtained.

It is available that the signals are binary digit signals of N-bits, and that the number of the input buffer circuits is N as well as that the number of the word line selection circuits is equal to the Nth power of 2.

It is also available that the number of the predecoder circuits is larger than the number of the input buffer circuits, and further available that the second threshold voltage in absolute value is larger than the first threshold voltage in absolute value.

It is also available that the number of the predecoder circuits is larger than the number of the input buffer circuits, and further available that the second threshold voltage in absolute value is equal to the first threshold voltage in absolute value.

It is also available that the number of the predecoder circuits is equal to the number of the input buffer circuits, and further available that the second threshold voltage in absolute value is larger than the first threshold voltage in absolute value.

It is also available that the number of the predecoder circuits is equal to the number of the input buffer circuits, and further available that the second threshold voltage in absolute value is equal to the first threshold voltage in absolute value.

It is also available that the number of the intermediate address selection circuits is larger than the number of the predecoder circuits, and further available that the third threshold voltage in absolute value is larger than the second threshold voltage in absolute value.

It is also available that the number of the intermediate address selection circuits is larger than the number of the predecoder circuits, and further available that the third threshold voltage in absolute value is equal to the second threshold voltage in absolute value.

It is also available that the number of the intermediate address selection circuits is equal to the number of the predecoder circuits, and further available that the third threshold voltage in absolute value is larger than the second threshold voltage in absolute value.

It is also available that the number of the intermediate address selection circuits is equal to the number of the predecoder circuits, and further available that the third threshold voltage in absolute value is equal to the second threshold voltage in absolute value.

It is also available that the number of the word line selection circuits is larger than the number of the intermediate address selection circuits, and further available that the fourth threshold voltage in absolute value is larger than the third threshold voltage in absolute value.

It is also available that the number of the word line selection circuits is equal to the number of the intermediate address selection circuits, and further available that the fourth threshold voltage in absolute value is larger than the third threshold voltage in absolute value.

It is also available that the number of the word line selection circuits is larger than the number of the intermediate address selection circuits, and further available that the fourth threshold voltage in absolute value is equal to the third threshold voltage in absolute value.

It is also available that the number of the word line selection circuits is equal to the number of the intermediate address selection circuits, and further available that the fourth threshold voltage in absolute value is equal to the third threshold voltage in absolute value.

It is also available that the second stage is divided into a plurality of subordinate second stages having different numbers of the predecoder circuits from each other, provided the number of the predecoder circuits in each of the subordinate second stages increases when the subordinate second stage approaches to the third stage, and further available that the second threshold voltage in absolute value of the predecoder circuits in each of the subordinate second stages increases when the subordinate second stage approaches to the third stage.

It is also available that the second stage is divided into a plurality of subordinate second stages having different numbers of the predecoder circuits from each other, provided that the number of the predecoder circuits in each of the subordinate second stages increases when the subordinate second stage approaches to the third stage, and further available that the second threshold voltage in absolute value of the predecoder circuits remains unchanged over the subordinate second stages.

It is also available that the second stage is divided into a plurality of subordinate second stages having a uniform number of the predecoder circuits, and further available that the second threshold voltage in absolute value of the predecoder circuits in each of the subordinate second stages increases when the subordinate second stage approaches to the third stage.

It is also available that the second stage is divided into a plurality of subordinate second stages having a uniform number of the predecoder circuits, and further available that the second threshold voltage in absolute value of the predecoder circuits remains unchanged over the subordinate second stages.

It is also available that the third stage is divided into a plurality of subordinate third stages having different numbers of the intermediate address selection circuits from each other, provided the number of the intermediate address selection circuits in each of the subordinate third stages increases when the subordinate third stage approaches to the fourth stage, and further available that the third threshold voltage in absolute value of the intermediate address selection circuits in each of the subordinate third stages increases when the subordinate third stage approaches to the fourth stage.

It is also available that the third stage is divided into a plurality of subordinate third stages having different numbers of the intermediate address selection circuits from each other, provided the number of the intermediate address selection circuits in each of the subordinate third stages increases when the subordinate third stage approaches to the fourth stage, and further available that the third threshold voltage in absolute value of the intermediate address selection circuits remains unchanged over the subordinate third stages.

It is also available that the third stage is divided into a plurality of subordinate third stages having a uniform number of the intermediate address selection circuits, and further available that the third threshold voltage in absolute value of the intermediate address selection circuits in each of the subordinate third stages increases when the subordinate third stage approaches to the fourth stage.

It is also available that the third stage is divided into a plurality of subordinate third stages having a uniform number of the intermediate address selection circuits, and further available that the third threshold voltage in absolute value of the intermediate address selection circuits remains unchanged over the subordinate third stages.

It is also available that the fourth stage is divided into a plurality of subordinate fourth stages having different numbers of the word line selection circuits from each other, provided the number of the word line selection circuits in each of the subordinate fourth stages increases when the subordinate fourth stage approaches to the word lines, and further available that the fourth threshold voltage in absolute value of the word line selection circuits in each of the subordinate fourth stages increases when the subordinate fourth stage approaches to the word lines.

It is also available that the fourth stage is divided into a plurality of subordinate fourth stages having different numbers of the word line selection circuits from each other, provided the number of the word line selection circuits in each of the subordinate fourth stages increases when the subordinate fourth stage approaches to the word lines, and further available that the fourth threshold voltage in absolute value of the word line selection circuits remains unchanged over the subordinate fourth stages.

It is also available that the fourth stage is divided into a plurality of subordinate fourth stages having a uniform number of the word line selection circuits, and further available that the fourth threshold voltage in absolute value of the word line selection circuits in each of the subordinate fourth stages increases when the subordinate fourth stage approaches to the word lines.

It is also available that the fourth stage is divided into a plurality of subordinate fourth stages having a uniform number of the word line selection circuits, and further available that the fourth threshold voltage in absolute value of the word line selection circuits remains unchanged over the subordinate fourth stages.

It is also available that each of the input buffer circuits includes at least a first CMIS circuit having the first threshold voltage in absolute value, and further available that each of the predecoder circuits includes at least a second CMIS circuit having the second threshold voltage in absolute value which is not less than the first threshold voltage in absolute value, and furthermore available that each of the intermediate address selection circuits includes at least a third CMIS circuit having the third threshold voltage in absolute value which is not less than the second threshold voltage in absolute value, and moreover available that each of the word line selection circuits includes at least a fourth CMIS circuit having the fourth threshold voltage in absolute value which is not less than the third threshold voltage in absolute value and the fourth threshold voltage in absolute value is larger than the first threshold voltage in absolute value.

The present invention provides another decoder circuitry being provided between input signal lines and word lines. The number of the word lines is larger than the input signal lines. The decoder circuitry comprises a plurality of stages including at least an input side stage adjacent to the input signal lines and an output side stage adjacent to the word lines. Each of the plurality of stages includes plural logic circuits. The plural stages so vary as not to decrease in the number of the logic circuits when the stage approaches to the word lines so that the number of the logic circuits in the input side stage adjacent to the input signal lines is smaller than the number of the logic circuits in the output side stage adjacent to the word lines. Each of the logic circuits has a plurality of field effect transistors. The field effect transistors so vary as not to decrease in absolute value of threshold voltage when the stage approaches to the word lines so that an absolute value of threshold voltage of the transistors provided in the input side stage adjacent to the input signal lines is smaller than an absolute value of threshold voltage of the transistors provided in the output side stage adjacent to the word lines.

The probability of operations of the transistors on the output side stage is lower than the probability of operations of the transistors on the input side stage since the number of the transistors on the fourth stage is smaller than the number of the transistors in the output side stage. This means that the probability that the transistors on the output side stage is in the stand-by state is larger than the probability that the transistors on the output side stage is in the stand-by state. Namely, the transistors on the output side stage are almost always in the stand-by state, whilst the transistors on the input side stage are often in the operating state. For the above reasons, the threshold voltage of the transistors on the output side stage has to be set at a relatively high to reduce a current leakage in the stand-by state. The transistors on the output side stage, where the threshold voltage is set high, show not so high speed performance. Since, however, the probability that the transistors of the output side stage are in the operating state is low, the above not so high speed performance of those transistors are not so influential in the operation speed of the decoder circuits.

The transistors on the input side stage, where the threshold voltage is set low, show high speed performances. Since the transistors on the input side stage are often in the operating state, the improvement in the high speed performance is influential in the high speed performance of the decoder circuits. Since, however, the transistors on the input side stage are often in the non-stand-by state or in the operating state, the current leakage caused by the above low threshold voltage of the transistors is not so influential for a current leakage of the decoder circuit.

Accordingly, the above novel circuit configurations both of the low threshed voltage of the transistors on the input side stage and of the high threshold voltage of the transistor on the output side stage would result in that both the improvement in the high speed performance of the decoder circuits and the reduction in the current leakage can be obtained.

It is available that input signal lines are transmitted with binary digit signals of N-bits, and also available that the number of logic circuits connected to the input signal lines is N as well as available that the number of logic circuits connected to the word lines is equal to the Nth power of 2.

In the above case, it is available that the plural stages comprises first, second third and fourth stages. The first stage includes input buffer circuits which are electrically connected to input signal lines. The number of the input buffer circuits is equal to the number of the input signal lines. The input buffer circuits include first p-channel field effect transistors and first n-channel field effect transistors. The first p-channel and n-channel field effect transistors have a first threshold voltage in absolute value. The second stage includes predecoder circuits which are electrically connected to the input buffer circuits. The number of the predecoder circuits is not less than the number of the input buffer circuits. The predecoder circuits include second p-channel field effect transistors and second n-channel field effect transistors. The second p-channel and n-channel field effect transistors have a second threshold voltage in absolute value which is not less than the first threshold voltage in absolute value. The third stage includes intermediate address selection circuits which are electrically connected to the predecoder circuits. The number of the intermediate address selection circuits is not less than the number of the predecoder circuits. The intermediate address selection circuits include third p-channel field effect transistors and third n-channel field effect transistors. The third p-channel and n-channel field effect transistors have a third threshold voltage in absolute value which is not less than the second threshold voltage in absolute value. The fourth stage includes word line selection circuits which are electrically connected to the intermediate address selection circuits. Each of the word line selection circuits is electrically connected to a word line. The number of the word line selection circuits is not less than the number of the intermediate address selection circuits and being larger than the number of the input buffer circuits. The word line selection circuits include fourth p-channel field effect transistors and fourth n-channel field effect transistors. The fourth p-channel and n-channel field effect transistors have a fourth threshold voltage in absolute value which is not less than the third threshold voltage in absolute value. The fourth threshold voltage in absolute value is larger than the first threshold voltage in absolute value.

It is available that input signals are binary digit signals of N-bits, and that the number of the input buffer circuits is N as well as that the number of the word line selection circuits is equal to the Nth power of 2.

It is also available that the number of the predecoder circuits is larger than the number of the input buffer circuits, and further available that the second threshold voltage in absolute value is larger than the first threshold voltage in absolute value.

It is also available that the number of the predecoder circuits is larger than the number of the input buffer circuits, and further available that the second threshold voltage in absolute value is equal to the first threshold voltage in absolute value.

It is also available that the number of the predecoder circuits is equal to the number of the input buffer circuits, and further available that the second threshold voltage in absolute value is larger than the first threshold voltage in absolute value.

It is also available that the number of the predecoder circuits is equal to the number of the input buffer circuits, and further available that the second threshold voltage in absolute value is equal to the first threshold voltage in absolute value.

It is also available that the number of the intermediate address selection circuits is larger than the number of the predecoder circuits, and further available that the third threshold voltage in absolute value is larger than the second threshold voltage in absolute value.

It is also available that the number of the intermediate address selection circuits is larger than the number of the predecoder circuits, and further available that the third threshold voltage in absolute value is equal to the second threshold voltage in absolute value.

It is also available that the number of the intermediate address selection circuits is equal to the number of the predecoder circuits, and further available that the third threshold voltage in absolute value is larger than the second threshold voltage in absolute value.

It is also available that the number of the intermediate address selection circuits is equal to the number of the predecoder circuits, and further available that the third threshold voltage in absolute value is equal to the second threshold voltage in absolute value.

It is also available that the number of the word line selection circuits is larger than the number of the intermediate address selection circuits, and further available that the fourth threshold voltage in absolute value is larger than the third threshold voltage in absolute value.

It is also available that the number of the word line selection circuits is equal to the number of the intermediate address selection circuits, and further available that the fourth threshold voltage in absolute value is larger than the third threshold voltage in absolute value.

It is also available that the number of the word line selection circuits is larger than the number of the intermediate address selection circuits, and further available that the fourth threshold voltage in absolute value is equal to the third threshold voltage in absolute value.

It is also available that the number of the word line selection circuits is equal to the number of the intermediate address selection circuits, and further available that the fourth threshold voltage in absolute value is equal to the third threshold voltage in absolute value.

It is also available that the second stage is divided into a plurality of subordinate second stages having different numbers of the predecoder circuits from each other, provided the number of the predecoder circuits in each of the subordinate second stages increases when the subordinate second stage approaches to the third stage, and further available that the second threshold voltage in absolute value of the predecoder circuits in each of the subordinate second stages increases when the subordinate second stage approaches to the third stage.

It is also available that the second stage is divided into a plurality of subordinate second stages having different numbers of the predecoder circuits from each other, provided that the number of the predecoder circuits in each of the subordinate second stages increases when the subordinate second stage approaches to the third stage, and further available that the second threshold voltage in absolute value of the predecoder circuits remains unchanged over the subordinate second stages.

It is also available that the second stage is divided into a plurality of subordinate second stages having a uniform number of the predecoder circuits, and further available that the second threshold voltage in absolute value of the predecoder circuits in each of the subordinate second stages increases when the subordinate second stage approaches to the third stage.

It is also available that the second stage is divided into a plurality of subordinate second stages having a uniform number of the predecoder circuits, and further available that the second threshold voltage in absolute value of the predecoder circuits remains unchanged over the subordinate second stages.

It is also available that the third stage is divided into a plurality of subordinate third stages having different numbers of the intermediate address selection circuits from each other, provided the number of the intermediate address selection circuits in each of the subordinate third stages increases when the subordinate third stage approaches to the fourth stage, and further available that the third threshold voltage in absolute value of the intermediate address selection circuits in each of the subordinate third stages increases when the subordinate third stage approaches to the fourth stage.

It is also available that the third stage is divided into a plurality of subordinate third stages having different numbers of the intermediate address selection circuits from each other, provided the number of the intermediate address selection circuits in each of the subordinate third stages increases when the subordinate third stage approaches to the fourth stage, and further available that the third threshold voltage in absolute value of the intermediate address selection circuits remains unchanged over the subordinate third stages.

It is also available that the third stage is divided into a plurality of subordinate third stages having a uniform number of the intermediate address selection circuits, and further available that the third threshold voltage in absolute value of the intermediate address selection circuits in each of the subordinate third stages increases when the subordinate third stage approaches to the fourth stage.

It is also available that the third stage is divided into a plurality of subordinate third stages having a uniform number of the intermediate address selection circuits, and further available that the third threshold voltage in absolute value of the intermediate address selection circuits remains unchanged over the subordinate third stages.

It is also available that the fourth stage is divided into a plurality of subordinate fourth stages having different numbers of the word line selection circuits from each other, provided the number of the word line selection circuits in each of the subordinate fourth stages increases when the subordinate fourth stage approaches to the word lines, and further available that the fourth threshold voltage in absolute value of the word line selection circuits in each of the subordinate fourth stages increases when the subordinate fourth stage approaches to the word lines.

It is also available that the fourth stage is divided into a plurality of subordinate fourth stages having different numbers of the word line selection circuits from each other, provided the number of the word line selection circuits in each of the subordinate fourth stages increases when the subordinate fourth stage approaches to the word lines, and further available that the fourth threshold voltage in absolute value of the word line selection circuits remains unchanged over the subordinate fourth stages.

It is also available that the fourth stage is divided into a plurality of subordinate fourth stages having a uniform number of the word line selection circuits, and further available that the fourth threshold voltage in absolute value of the word line selection circuits in each of the subordinate fourth stages increases when the subordinate fourth stage approaches to the word lines.

It is also available that the fourth stage is divided into a plurality of subordinate fourth stages having a uniform number of the word line selection circuits, and further available that the fourth threshold voltage in absolute value of the word line selection circuits remains unchanged over the subordinate fourth stages.

It is also available that each of the input buffer circuits includes at least a first CMIS circuit having the first threshold voltage in absolute value, and further available that each of the predecoder circuits includes at least a second CMIS circuit having the second threshold voltage in absolute value which is not less than the first threshold voltage in absolute value, and furthermore available that each of the intermediate address selection circuits includes at least a third CMIS circuit having the third threshold voltage in absolute value which is not less than the second threshold voltage in absolute value, and moreover available that each of the word line selection circuits includes at least a fourth CMIS circuit having the fourth threshold voltage in absolute value which is not less than the third threshold voltage in absolute value and the fourth threshold voltage in absolute value is larger than the first threshold voltage in absolute value.

EMBODIMENT

Figure 2:
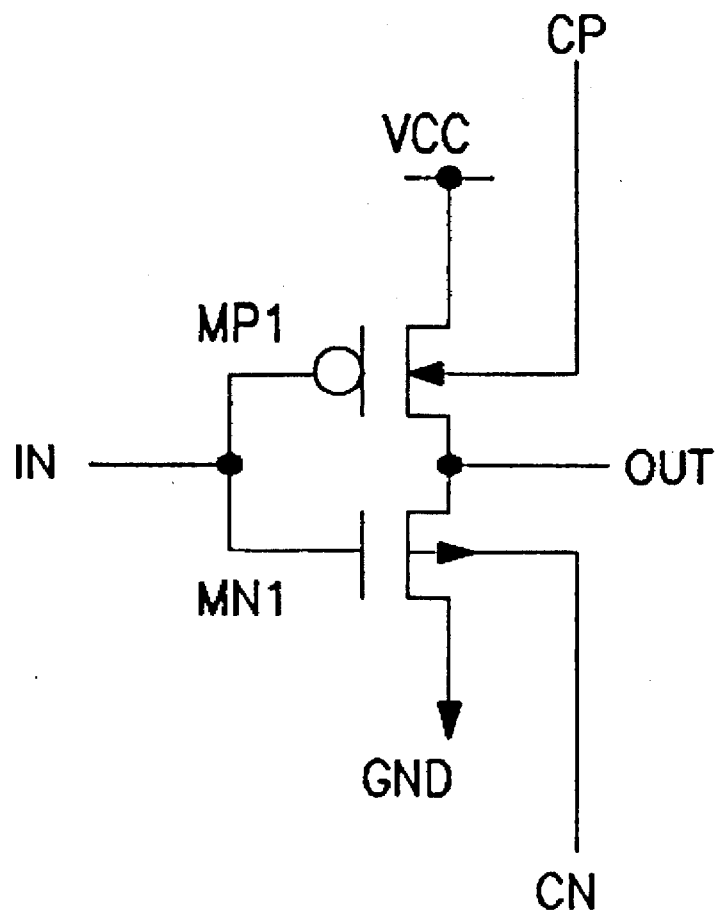
FIG. 2 is a circuit diagram illustrative of a CMIS circuit included in a novel decoder circuitry in a preferred embodiment according to the present invention.

A preferred embodiment according to the present invention will be described in detail with reference to FIGS. 1 and 2. The decoder circuits are designed to process binary digit signals of 5-bits, for which reason five input signal lines A0, A1, A2, A3 and A4 are provided to be connected to the decoder circuits. The decoder circuits are connected to word lines WL0, WL1, WL2 . . . WL31, wherein the number of the word lines is the fifth power of 2, for example, 32. The decoder circuits have five input terminals connected to the five input signal lines A0, A1, A2, A3 and A4. The input signal lines are provided to transmit address signals of 5-bits, wherein each of the input signal lines is one bit signal. The decoder circuit has an input buffer circuit stage on which five input buffer logic circuits "IB" are provided to be connected to the five input signal lines respectively. The decoder circuits have a predecoder circuit stage on which predecoder logic circuits "PD" which are provided to be connected to output sides of the input buffer logic circuits "IB". The decoder circuits also have an intermediate address selection circuit stage on which intermediate address selection logic circuits "DEC" are provided to be connected to output sides of the predecoder logic circuits "PD". The number of the intermediate address selection logic circuits "DEC" is larger than the number of the predecoder logic circuits "PD". The decoder circuits also have a word line selection circuit stage on which word line selection circuits "WD" are provided to be connected to output sides of the intermediate address selection logic circuits "DEC". The number of the word line selection circuits "WD" is larger than the number of the intermediate address selection logic circuits "DEC". For example, the number of the word line selection circuits "WD" is 32. The word line selection circuits "WD" are further connected to 32 of the word lines WL0, WL1, . . . WL31. The address input signals of 5-bits are decoded by the decoder circuits so that 32 kinds of the 5-bits input signals are decoded and outputted from any one of the 32 word lines.

The above decoder circuits are designed in the form of CMIS circuits. In detail, the above input buffer logic circuits "IB", predecoder logic circuits "PD", intermediate address selection logic circuits "DEC" and the word line selection circuits "WD" are formed of the CMIS circuits. Each of the CMIS circuits comprises a pair of n-channel and p-channel MISFETs. The CMIS circuits on the above four stages vary in threshold voltage over the above different stages.

The threshold voltage of the CMIS circuits on the input buffer circuit stage is smaller than the threshold voltage of the CMIS circuits on the predecoder circuit stage. The threshold voltage of the CMIS circuits on the predecoder circuit stage is, however, smaller than the threshold voltage of the CMIS circuits on the intermediate address selection circuit stage. The threshold voltage of the CMIS circuits on the intermediate address selection circuit stage is, however, smaller than the threshold voltage of the CMIS circuits on the word line selection circuit stage.

The threshold voltage of the n-channel MIS field effect transistors on the input buffer circuit stage is smaller than the threshold voltage of the n-channel MIS field effect transistors on the predecoder circuit stage. The threshold voltage of the n-channel MIS field effect transistors on the predecoder circuit stage is, however, smaller than the threshold voltage of the n-channel MIS field effect transistors on the intermediate address selection circuit stage. The threshold voltage of the n-channel MIS field effect transistors on the intermediate address selection circuit stage is, however, smaller than the threshold voltage of the n-channel MIS field effect transistors on the word line selection circuit stage.

The threshold voltage of the p-channel MIS field effect transistors on the input buffer circuit stage is larger than the threshold voltage of the p-channel MIS field effect transistors on the predecoder circuit stage. The threshold voltage of the p-channel MIS field effect transistors on the predecoder circuit stage is, however, larger than the threshold voltage of the p-channel MIS field effect transistors on the intermediate address selection circuit stage. The threshold voltage of the p-channel MIS field effect transistors on the intermediate address selection circuit stage is, however, larger than the threshold voltage of the p-channel MIS field effect transistors on the word line selection circuit stage.

The above threshold voltage of the n-channel and p-channel MIS field effect transistors is controllable by either controlling a dose of ion-implantation into channel regions of the n-channel and p-channel MIS field effect transistors or controlling a channel length of the n-channel and p-channel MIS field effect transistors. Moreover, the threshold voltage of the CMIS circuits is also controllable by controlling a substrate voltage. Those techniques have been well known in the art to which the invention pertains to control the threshold voltage of the n-channel and p-channel MIS field effect transistors.

In the above decoder circuits, the input signals of 5-bits are decoded and then output signals decoded do appear on the word lines, wherein any one of the 32 word lines is at the high level whilst the remaining 31 word lines are at the low level. The probability that the word line selection logic circuits enter into the operating state is very low, for example, one thirty-seconds, whilst the probability that the word line selection logic circuits enter into the stand-by state is very high, for example, thirty-one thirty-seconds. By contrast, the probability that the input buffer logic circuits and the predecoder circuits enter into the operating state is relatively high whilst the probability that the input buffer logic circuits and the predecoder circuits enter into the stand-by state is relatively low.

This means that the sufficiently low threshold voltage of the transistors in the input buffer logic circuits sufficiently improves the high speed performance. Since the transistors in the input buffer logic circuits are almost always in the operating state namely non-stand-by state, the sufficiently low threshold voltage of the transistors in the input buffer logic circuits provides less increase in the current leakage which appears in the stand-by state. Further, the above mater means that the sufficiently high threshold voltage of the transistors in the word line selection circuits sufficiently reduces the current leakage. Since the transistors in the word line selection logic circuits are almost always in the stand-by state namely non-operating state, the sufficiently high threshold voltage of the transistors in the word line selection logic circuits provides less influences to the high speed performance of the decoder circuits.

Accordingly, the above novel circuit configurations, that the transistors increase in threshold voltage when the positions approach to the word lines the word lines, would result in that both the improvement in the high speed performance of the decoder circuits and the reduction in the current leakage can be obtained.

The above input buffer circuits and the decoder circuits may comprise emitter coupled logic circuits in place of the CMIS circuits.

Needless to say, the number of bits of the input signals are not limited to 5.

The above described person invention may be applicable to any decoder circuits other than address decoder circuits.

Whereas modifications of the present invention will be apparent to a person having ordinary skill in the art, to which the invention pertains, it is to be understood that the embodiment as shown and described by way of illustrations are by no means intended to be considered in a limiting sense. Accordingly, it is to be intended to cover by claims all modifications which fall within the spirit and scope of the invention.

What is claimed is:

1. A decoder circuitry comprising:
    a first stage including input buffer circuits being electrically connected to input signal lines, the number of said input buffer circuits being equal to the number of said input signal lines, said input buffer circuits including first p-channel field effect transistors and first n-channel field effect transistors, said first p-channel and n-channel field effect transistors having a first threshold voltage in absolute value;

a second stage including predecoder circuits being electrically connected to said input buffer circuits, the number of said predecoder circuits being not less than the number of said input buffer circuits, said predecoder circuits including second p-channel field effect transistors and second n-channel field effect transistors, said second p-channel and n-channel field effect transistors having a second threshold voltage in absolute value which is not less than said first threshold voltage in absolute value;

a third stage including intermediate address selection circuits being electrically connected to said predecoder circuits, the number of said intermediate address selection circuits being not less than the number of said predecoder circuits, said intermediate address selection circuits including third p-channel field effect transistors and third n-channel field effect transistors, said third p-channel and n-channel field effect transistors having a third threshold voltage in absolute value which is not less than said second threshold voltage in absolute value; and a fourth stage including word line selection circuits being electrically connected to said intermediate address selection circuits, each of said word line selection circuits being electrically connected to a word line, the number of said word line selection circuits being not less than the number of said intermediate address selection circuits and being larger than the number of said input buffer circuits, said word line selection circuits including fourth p-channel field effect transistors and fourth n-channel field effect transistors, said fourth p-channel and n-channel field effect transistors having a fourth threshold voltage in absolute value which is not less than said third threshold voltage in absolute value and said fourth threshold voltage in absolute value being larger than said first threshold voltage in absolute value.

2. The decoder circuitry as claimed in claim 1, wherein input signals are binary digit signals of N-bits, and the number of said input buffer circuits is N as well as the number of said word line selection circuits is equal to the Nth power of 2.

3. The decoder circuitry as claimed in claim 1, wherein the number of said predecoder circuits is larger than the number of said input buffer circuits, and further said second threshold voltage in absolute value is larger than said first threshold voltage in absolute value.

4. The decoder circuitry as claimed in claim 1, wherein the number of said predecoder circuits is larger than the number of said input buffer circuits, and further said second threshold voltage in absolute value is equal to said first threshold voltage in absolute value.

5. The decoder circuitry as claimed in claim 1, wherein the number of said predecoder circuits is equal to the number of said input buffer circuits, and further said second threshold voltage in absolute value is larger than said first threshold voltage in absolute value.

6. The decoder circuitry as claimed in claim 1, wherein the number of said predecoder circuits is equal to the number of said input buffer circuits, and further said second threshold voltage in absolute value is equal to said first threshold voltage in absolute value.

7. The decoder circuitry as claimed in claim 1, wherein the number of said intermediate address selection circuits is larger than the number of said predecoder circuits, and further said third threshold voltage in absolute value is larger than said second threshold voltage in absolute value.

8. The decoder circuitry as claimed in claim 1, wherein the number of said intermediate address selection circuits is larger than the number of said predecoder circuits, and further said third threshold voltage in absolute value is equal to said second threshold voltage in absolute value.

9. The decoder circuitry as claimed in claim 1, wherein the number of said intermediate address selection circuits is equal to the number of said predecoder circuits, and further said third threshold voltage in absolute value is larger than said second threshold voltage in absolute value.

10. The decoder circuitry as claimed in claim 1, wherein the number of said intermediate address selection circuits is equal to the number of said predecoder circuits, and further said third threshold voltage in absolute value is equal to said second threshold voltage in absolute value.

11. The decoder circuitry as claimed in claim 1, wherein the number of said word line selection circuits is larger than the number of said intermediate address selection circuits, and further said fourth threshold voltage in absolute value is larger than said third threshold voltage in absolute value.

12. The decoder circuitry as claimed in claim 1, wherein the number of said word line selection circuits is equal to the number of said intermediate address selection circuits, and further said fourth threshold voltage in absolute value is larger than said third threshold voltage in absolute value.

13. The decoder circuitry as claimed in claim 1, wherein the number of said word line selection circuits is larger than the number of said intermediate address selection circuits, and further said fourth threshold voltage in absolute value is equal to said third threshold voltage in absolute value.

14. The decoder circuitry as claimed in claim 1, wherein the number of said word line selection circuits is equal to the number of said intermediate address selection circuits, and further said fourth threshold voltage in absolute value is equal to said third threshold voltage in absolute value.

15. The decoder circuitry as claimed in claim 1,
wherein said second stage is divided into a plurality of subordinate second stages having different numbers of said predecoder circuits from each other, provided that the number of said predecoder circuits in each of said subordinate second stages increases when said subordinate second stage approaches to said third stage, and
wherein said second threshold voltage in absolute value of said predecoder circuits in each of said subordinate second stages increases when said subordinate second stage approaches to said third stage.

16. The decoder circuitry as claimed in claim 1,
wherein said second stage is divided into a plurality of subordinate second stages having different numbers of said predecoder circuits from each other, provided that the number of said predecoder circuits in each of said subordinate second stages increases when said subordinate second stage approaches to said third stage, and
wherein said second threshold voltage in absolute value of said predecoder circuits remains unchanged over said subordinate second stages.

17. The decoder circuitry as claimed in claim 1,
wherein said second stage is divided into a plurality of subordinate second stages having a uniform number of said predecoder circuits, and
wherein said second threshold voltage in absolute value of said predecoder circuits in each of said subordinate second stages increases when said subordinate second stage approaches to said third stage.

18. The decoder circuitry as claimed in claim 1,
wherein said second stage is divided into a plurality of subordinate second stages having a uniform number of said predecoder circuits, and
wherein said second threshold voltage in absolute value of said predecoder circuits remains unchanged over said subordinate second stages.

19. The decoder circuitry as claimed in claim 1,
wherein said third stage is divided into a plurality of subordinate third stages having different numbers of said intermediate address selection circuits from each other, provided that the number of said intermediate address selection circuits in each of said subordinate third stages increases when said subordinate third stage approaches to said fourth stage, and
wherein said third threshold voltage in absolute value of said intermediate address selection circuits in each of said subordinate third stages increases when said subordinate third stage approaches to said fourth stage.

20. The decoder circuitry as claimed in claim 1,
wherein said third stage is divided into a plurality of subordinate third stages having different numbers of said intermediate address selection circuits from each other, provided that the number of said intermediate address selection circuits in each of said subordinate third stages increases when said subordinate third stage approaches to said fourth stage, and
wherein said third threshold voltage in absolute value of said intermediate address selection circuits remains unchanged over said subordinate third stages.

21. The decoder circuitry as claimed in claim 1,
wherein said third stage is divided into a plurality of subordinate third stages having a uniform number of said intermediate address selection circuits, and
wherein said third threshold voltage in absolute value of said intermediate address selection circuits in each of said subordinate third stages increases when said subordinate third stage approaches to said fourth stage.

22. The decoder circuitry as claimed in claim 1,
wherein said third stage is divided into a plurality of subordinate third stages having a uniform number of said intermediate address selection circuits, and
wherein said third threshold voltage in absolute value of said intermediate address selection circuits remains unchanged over said subordinate third stages.

23. The decoder circuitry as claimed in claim 1,
wherein said fourth stage is divided into a plurality of subordinate fourth stages having different numbers of said word line selection circuits from each other, provided that the number of said word line selection circuits in each of said subordinate fourth stages increases when said subordinate fourth stage approaches to said word lines, and
wherein said fourth threshold voltage in absolute value of said word line selection circuits in each of said subordinate fourth stages increases when said subordinate fourth stage approaches to said word lines.

24. The decoder circuitry as claimed in claim 1,
wherein said fourth stage is divided into a plurality of subordinate fourth stages having different numbers of said word line selection circuits from each other, provided that the number of said word line selection circuits in each of said subordinate fourth stages increases when said subordinate fourth stage approaches to said word lines, and
wherein said fourth threshold voltage in absolute value of said word line selection circuits remains unchanged over said subordinate fourth stages.

25. The decoder circuitry as claimed in claim 1,
wherein said fourth stage is divided into a plurality of subordinate fourth stages having a uniform number of said word line selection circuits, and
wherein said fourth threshold voltage in absolute value of said word line selection circuits in each of said subordinate fourth stages increases when said subordinate fourth stage approaches to said word lines.

26. The decoder circuitry as claimed in claim 1,
wherein said fourth stage is divided into a plurality of subordinate fourth stages having a uniform number of said word line selection circuits, and
wherein said fourth threshold voltage in absolute value of said word line selection circuits remains unchanged over said subordinate fourth stages.

27. The decoder circuitry as claimed in claim 1,
wherein each of said input buffer circuits includes at least a first CMIS circuit having said first threshold voltage in absolute value,
wherein each of said predecoder circuits includes at least a second CMIS circuit having said second threshold voltage in absolute value which is not less than said first threshold voltage in absolute value,
wherein each of said intermediate address selection circuits includes at least a third CMIS circuit having said third threshold voltage in absolute value which is not less than said second threshold voltage in absolute value, and
wherein each of said word line selection circuits includes at least a fourth CMIS circuit having said fourth threshold voltage in absolute value which is not less than said third threshold voltage in absolute value and said fourth threshold voltage in absolute value is larger than said first threshold voltage in absolute value.

28. A decoder circuitry provided between input signal lines and word lines, the number of said word lines being larger than said input signal lines, said decoder circuitry comprising a plurality of stages including an input side stage adjacent to said input signal lines and an output side stage adjacent to said word lines, each of said plurality of stages including plural logic circuits, said plurality of stages so vary as not to decrease in the number of said logic circuits when said stage approaches to said word lines so that the number of said logic circuits in said input side stage adjacent to said input signal lines is smaller than the number of said logic circuits in said output side stage adjacent to said word lines, each of said logic circuits having a plurality of field effect transistors,
wherein said field effect transistors so vary as not to decrease in absolute value of threshold voltage when said stage approaches to said word lines so that an absolute value of threshold voltage of said transistors provided in said input side stage adjacent to said input signal lines is smaller than an absolute value of threshold voltage of said transistors provided in said output side stage adjacent to said word lines.

29. The decoder circuitry as claimed in claim 28, wherein input signal lines are transmitted with binary digit signals of N-bits, and the number of logic circuits connected to said input signal lines is N as well as the number of logic circuits connected to said word lines is equal to the Nth power of 2.

30. The decoder circuitry as claimed in claim 28, wherein said plurality of stages comprises:

a first stage including input buffer circuits being electrically connected to input signal lines, the number of said input buffer circuits being equal to the number of said input signal lines, said input buffer circuits including first p-channel field effect transistors and first n-channel field effect transistors, said first p-channel and n-channel field effect transistors having a first threshold voltage in absolute value;

a second stage including predecoder circuits being electrically connected to said input buffer circuits, the number of said predecoder circuits being not less than the number of said input buffer circuits, said predecoder circuits including second p-channel field effect transistors and second n-channel field effect transistors, said second p-channel and n-channel field effect transistors having a second threshold voltage in absolute value which is not less than said first threshold voltage in absolute value;

a third stage including intermediate address selection circuits being electrically connected to said predecoder circuits, the number of said intermediate address selection circuits being not less than the number of said predecoder circuits, said intermediate address selection circuits including third p-channel field effect transistors and third n-channel field effect transistors, said third p-channel and n-channel field effect transistors having a third threshold voltage in absolute value which is not less than said second threshold voltage in absolute value; and a fourth stage including word line selection circuits being electrically connected to said intermediate address selection circuits, each of said word line selection circuits being electrically connected to a word line, the number of said word line selection circuits being not less than the number of said intermediate address selection circuits and being larger than the number of said input buffer circuits, said word line selection circuits including fourth p-channel field effect transistors and fourth n-channel field effect transistors, said fourth p-channel and n-channel field effect transistors having a fourth threshold voltage in absolute value which is not less than said third threshold voltage in absolute value and said fourth threshold voltage in absolute value being larger than said first threshold voltage in absolute value.

31. The decoder circuitry as claimed in claim 30, wherein input signals are binary digit signals of N-bits, and the number of said input buffer circuits is N as well as the number of said word line selection circuits is equal to the Nth power of 2.

32. The decoder circuitry as claimed in claim 30, wherein the number of said predecoder circuits is larger than the number of said input buffer circuits, and further said second threshold Voltage in absolute value is larger than said first threshold voltage in absolute value.

33. The decoder circuitry as claimed in claim 30, wherein the number of said predecoder circuits is larger than the number of said input buffer circuits, and further said second threshold voltage in absolute value is equal to said first threshold voltage in absolute value.

34. The decoder circuitry as claimed in claim 30, wherein the number of said predecoder circuits is equal to the number of said input buffer circuits, and further said second threshold voltage in absolute value is larger than said first threshold voltage in absolute value.

35. The decoder circuitry as claimed in claim 30, wherein the number of said predecoder circuits is equal to the number of said input buffer circuits, and further said second threshold voltage in absolute value is equal to said first threshold voltage in absolute value.

36. The decoder circuitry as claimed in claim 30, wherein the number of said intermediate address selection circuits is larger than the number of said predecoder circuits, and further said third threshold voltage in absolute value is larger than said second threshold voltage in absolute value.

37. The decoder circuitry as claimed in claim 30, wherein the number of said intermediate address selection circuits is larger than the number of said predecoder circuits, and further said third threshold voltage in absolute value is equal to said second threshold voltage in absolute value.

38. The decoder circuitry as claimed in claim 30, wherein the number of said intermediate address selection circuits is equal to the number of said predecoder circuits, and further said third threshold voltage in absolute value is larger than said second threshold voltage in absolute value.

39. The decoder circuitry as claimed in claim 30, wherein the number of said intermediate address selection circuits is equal to the number of said predecoder circuits, and further said third threshold voltage in absolute value is equal to said second threshold voltage in absolute value.

40. The decoder circuitry as claimed in claim 30, wherein the number of said word line selection circuits is larger than the number of said intermediate address selection circuits, and further said fourth threshold voltage in absolute value is larger than said third threshold voltage in absolute value.

41. The decoder circuitry as claimed in claim 30, wherein the number of said word line selection circuits is equal to the number of said intermediate address selection circuits, and further said fourth threshold voltage in absolute value is larger than said third threshold voltage in absolute value.

42. The decoder circuitry as claimed in claim 30, wherein the number of said word line selection circuits is larger than the number of said intermediate address selection circuits, and further said fourth threshold voltage in absolute value is equal to said third threshold voltage in absolute value.

43. The decoder circuitry as claimed in claim 30, wherein the number of said word line selection circuits is equal to the number of said intermediate address selection circuits, and further said fourth threshold voltage in absolute value is equal to said third threshold voltage in absolute value.

44. The decoder circuitry as claimed in claim 30,
wherein said second stage is divided into a plurality of subordinate second stages having different numbers of said predecoder circuits from each other, provided that the number of said predecoder circuits in each of said subordinate second stages increases when said subordinate second stage approaches to said third stage, and
wherein said second threshold voltage in absolute value of said predecoder circuits in each of said subordinate second stages increases when said subordinate second stage approaches to said third stage.

45. The decoder circuitry as claimed in claim 30,
wherein said second stage is divided into a plurality of subordinate second stages having different numbers of said predecoder circuits from each other, provided that the number of said predecoder circuits in each of said subordinate second stages increases when said subordinate second stage approaches to said third stage, and
wherein said second threshold voltage in absolute value of said predecoder circuits remains unchanged over said subordinate second stages.

46. The decoder circuitry as claimed in claim 30,
wherein said second stage is divided into a plurality of subordinate second stages having a uniform number of said predecoder circuits, and wherein said second threshold voltage in absolute value of said predecoder circuits in each of said subordinate second stages increases when said subordinate second stage approaches to said third stage.

47. The decoder circuitry as claimed in claim 30, wherein said second stage is divided into a plurality of subordinate second stages having a uniform number of said predecoder circuits, and wherein said second threshold voltage in absolute value of said predecoder circuits remains unchanged over said subordinate second stages.

48. The decoder circuitry as claimed in claim 30, wherein said third stage is divided into a plurality of subordinate third stages having different numbers of said intermediate address selection circuits from each other, provided that the number of said intermediate address selection circuits in each of said subordinate third stages increases when said subordinate third stage approaches to said fourth stage, and wherein said third threshold voltage in absolute value of said intermediate address selection circuits in each of said subordinate third stages increases when said subordinate third stage approaches to said fourth stage.

49. The decoder circuitry as claimed in claim 30, wherein said third stage is divided into a plurality of subordinate third stages having different numbers of said intermediate address selection circuits from each other, provided that the number of said intermediate address selection circuits in each of said subordinate third stages increases when said subordinate third stage approaches to said fourth stage, and wherein said third threshold voltage in absolute value of said intermediate address selection circuits remains unchanged over said subordinate third stages.

50. The decoder circuitry as claimed in claim 30, wherein said third stage is divided into a plurality of subordinate third stages having a uniform number of said intermediate address selection circuits, and wherein said third threshold voltage in absolute value of said intermediate address selection circuits in each of said subordinate third stages increases when said subordinate third stage approaches to said fourth stage.

51. The decoder circuitry as claimed in claim 30, wherein said third stage is divided into a plurality of subordinate third stages having a uniform number of said intermediate address selection circuits, and wherein said third threshold voltage in absolute value of said intermediate address selection circuits remains unchanged over said subordinate third stages.

52. The decoder circuitry as claimed in claim 30, wherein said fourth stage is divided into a plurality of subordinate fourth stages having different numbers of said word line selection circuits from each other, provided that the number of said word line selection circuits in each of said subordinate fourth stages increases when said subordinate fourth stage approaches to said word lines, and wherein said fourth threshold voltage in absolute value of said word line selection circuits in each of said subordinate fourth stages increases when said subordinate fourth stage approaches to said word lines.

53. The decoder circuitry as claimed in claim 30, wherein said fourth stage is divided into a plurality of subordinate fourth stages having different numbers of said word line selection circuits from each other, provided that the number of said word line selection circuits in each of said subordinate fourth stages increases when said subordinate fourth stage approaches to said word lines, and wherein said fourth threshold voltage in absolute value of said word line selection circuits remains unchanged over said subordinate fourth stages.

54. The decoder circuitry as claimed in claim 30, wherein said fourth stage is divided into a plurality of subordinate fourth stages having a uniform number of said word line selection circuits, and wherein said fourth threshold voltage in absolute value of said word line selection circuits in each of said subordinate fourth stages increases when said subordinate fourth stage approaches to said word lines.

55. The decoder circuitry as claimed in claim 30, wherein said fourth stage is divided into a plurality of subordinate fourth stages having a uniform number of said word line selection circuits, and wherein said fourth threshold voltage in absolute value of said word line selection circuits remains unchanged over said subordinate fourth stages.

56. The decoder circuitry as claimed in claim 30, wherein each of said input buffer circuits includes at least a first CMIS circuit having said first threshold voltage in absolute value, wherein each of said predecoder circuits includes at least a second CMIS circuit having said second threshold voltage in absolute value which is not less than said first threshold voltage in absolute value, wherein each of said intermediate address selection circuits includes at least a third CMIS circuit having said third threshold voltage in absolute value which is not less than said second threshold voltage in absolute value, and wherein each of said word line selection circuits includes at least a fourth CMIS circuit having said fourth threshold voltage in absolute value which is not less than said third threshold voltage in absolute value and said fourth threshold voltage in absolute value is larger than said first threshold voltage in absolute value.

* * * * *